United States Patent
Chieng et al.

(10) Patent No.: US 11,569,696 B2
(45) Date of Patent: Jan. 31, 2023

(54) CONTROL METHOD OF A MINIMUM POWER INPUT

(71) Applicant: National Yang Ming Chiao Tung University, Hsinchu (TW)

(72) Inventors: Wei-Hua Chieng, Hsinchu (TW); Edward Yi Chang, Baoshan Township (TW); Stone Cheng, Hsinchu (TW); Shyr-Long Jeng, Tainan (TW); Newton Tang, Taoyuan (TW); Chih-Chiang Wu, Zhudong Township (TW); Ching-Yao Liu, Hsinchu (TW); Kuo-Bin Wang, Hsinchu (TW)

(73) Assignee: NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 70 days.

(21) Appl. No.: 17/334,058

(22) Filed: May 28, 2021

(65) Prior Publication Data
US 2022/0285999 A1 Sep. 8, 2022

(30) Foreign Application Priority Data
Mar. 5, 2021 (TW) .................................. 110107895

(51) Int. Cl.
*H02J 50/60* (2016.01)
*H02J 50/90* (2016.01)
(Continued)

(52) U.S. Cl.
CPC .............. *H02J 50/90* (2016.02); *H02J 50/40* (2016.02); *H03F 3/2176* (2013.01)

(58) Field of Classification Search
CPC .......... H02J 50/90; H02J 50/40; H03F 3/2176
See application file for complete search history.

(56) References Cited

U.S. PATENT DOCUMENTS 6,240,318 B1 * 5/2001 Phillips ................ A61N 1/3787
607/61
8,872,385 B2 10/2014 Kinoshita et al.
(Continued)

FOREIGN PATENT DOCUMENTS

TW  I618349 B  3/2018

OTHER PUBLICATIONS

Aldhaher et al., "Wireless power transfer using Class E inverter with saturable DC-feed inductor", IEEE Transactions on Industry Applications, Jul./Aug. 2014, vol. 50, No. 4, pp. 2710-2718.
(Continued)

*Primary Examiner* — Daniel Kessie
*Assistant Examiner* — Brian K Baxter
(74) *Attorney, Agent, or Firm* — Birch, Stewart, Kolasch & Birch, LLP

(57) ABSTRACT

A control method of a minimum power input applicable to a wireless power transfer system including a power transmission unit and at least one power receiving unit is provided. The power transmission unit is electrically connected with a control voltage signal and an input voltage signal and accordingly generates the minimum power input. The power transmission unit transmits the minimum power input wirelessly through a wireless transmission to the at least one power receiving unit for receiving. By adjusting the input voltage signal, the duty ratio and resonant frequency of the control voltage signal, the present invention ensures an optimal power transmission efficiency of the wireless power transmission system. Moreover, parameters of a charge pump reservoir and gate driving circuit can be further designed in view of the trend feedback of its gate drive waveforms so as to optimize the effect of the proposed invention.

9 Claims, 9 Drawing Sheets

(51) Int. Cl.
*H03F 3/217* (2006.01)
*H02J 50/40* (2016.01)

(56) References Cited

U.S. PATENT DOCUMENTS

| | | | |
|---|---|---|---|
| 9,899,877 B2 | 2/2018 | Mitcheson et al. | |
| 11,056,922 B1* | 7/2021 | Shostak | H02J 50/10 |
| 2011/0298294 A1* | 12/2011 | Takada | B60L 53/12 |
| | | | 307/104 |
| 2012/0161536 A1* | 6/2012 | Kamata | H02J 7/00034 |
| | | | 307/104 |
| 2012/0187771 A1* | 7/2012 | Kamata | H01F 38/14 |
| | | | 307/104 |
| 2015/0214918 A1* | 7/2015 | Kamata | H01F 38/14 |
| | | | 307/104 |
| 2015/0303714 A1* | 10/2015 | Keeling | B60L 53/66 |
| | | | 320/108 |
| 2017/0250574 A1* | 8/2017 | Min | H02J 50/402 |
| 2018/0083488 A1* | 3/2018 | Menegoli | H04B 5/0025 |
| 2018/0115291 A1* | 4/2018 | Mizokami | H03F 3/245 |
| 2018/0159382 A1* | 6/2018 | Lin | H02J 50/50 |
| 2018/0241249 A1* | 8/2018 | Von Novak, III | H02J 50/12 |
| 2018/0301939 A1* | 10/2018 | Byun | H02J 7/00034 |
| 2019/0379241 A1* | 12/2019 | Kim | H02J 7/00034 |
| 2020/0044485 A1* | 2/2020 | Smith | H04B 5/0037 |
| 2020/0127495 A1* | 4/2020 | Matsuda | H02J 50/80 |
| 2020/0381947 A1* | 12/2020 | Bhandarkar | H02M 3/1582 |
| 2021/0152035 A1* | 5/2021 | Smith | G06F 21/81 |
| 2022/0037926 A1* | 2/2022 | Omori | H02J 7/00034 |
| 2022/0278561 A1* | 9/2022 | Choi | H02J 50/10 |

OTHER PUBLICATIONS

Sokal et al., "Class E-A new class of high-efficiency tuned single-ended switching power amplifiers", IEEE Journal of Solid-State Circuits, Jun. 1975, vol. SC-10, No. 3, pp. 168-176.

Sokal, "Class-E RF power amplifiers," QEX Commun. Quart., Jan./Feb. 2001, No. 204, pp. 9-20.

Weng et al., "Minimum Power Input Control for Class-E Amplifier Using Depletion-Mode Gallium Nitride High Electron Mobility Transistor", Energies, 2021, vol. 14, No. 2302, pp. 1-16.

* cited by examiner

CONTROL METHOD OF A MINIMUM POWER INPUT

This application claims priority of Application No. 110107895 filed in Taiwan on 5 Mar. 2021 under 35 U.S.C. § 119; the entire contents of all of which are hereby incorporated by reference.

BACKGROUND OF THE INVENTION

Field of the Invention

The present invention relates to techniques of wireless power transmission regulations. More particularly, it is related to a control method for minimum of a power input such that an optimal wireless power transmission efficiency is obtained.

Description of the Prior Art

In general, wireless charging technologies can be effectively used for reducing time and space costs due to better portability, high efficiency, rapid speed and instant response. Meanwhile, since wireless charging technologies have been successfully made various electronic products free from the physical wires and solved the problems of limited storage power, it is believed that one of the best choices for the new generation of consumer electronics upgrades definitely reply on the wireless charging technologies.

In recent years, a variety of industries and/or academic institutions have all gradually increased patent researches, especially on wireless charging technologies. For instance, an U.S. Pat. No. 8,872,385B2 discloses a wireless power transmission system which transmits power wirelessly from a power transmitter to a power receiver. The power receiver includes a receiving-end resonant circuit, a rectifier circuit, a power reproducing section, and an impedance changer connected between the rectifier circuit and the power reproducing section to change its impedance. When the impedance is changed, a detector is employed to detect the waveform variation and a signal extractor can further be used to extract and output a signal corresponding to the waveform detected by the detector.

Another prior art, as Taiwan patent number 1618349 discloses an impedance transformation network for improved driver circuit performance, in which a transmitter apparatus is provided. The transmitter apparatus includes a driver circuit characterized by an efficiency and a power output level. The driver circuit further includes a filter circuit, which is electrically connected to the driver circuit and configured to modify the impedance of the transmit circuit to maintain the efficiency of the driver circuit at a level that is within 20% of a maximum efficiency of the driver circuit when the impedance is within the complex impedance range. However, it is worth noticing that all the above-mentioned patent applications were proposed to control its power transmission efficiency only by means of modifying the impedance of its transmission circuits.

On account of these, another prior art U.S. Pat. No. 9,899,877 was proposed to disclose an improved invention without modifying the impedance, which is an inductive power transfer system. The inductive power transfer system includes a transmitter circuit comprising a transmitter coil and a receiver circuit comprising a receiver coil spaced from the transmitter coil. Such invention was designed to control the inductive power transmission through the coupling effect of the transmission energy between the coils and the adjustments of the coils mechanical design, spacing and parameters between the coils. In such invention, the receiver circuit has a resonant frequency, and the transmitter circuit is designed to be configured to change its first frequency in order to meet a desired impedance of its primary tank circuit. However, it again, draws our attention that by these known technical means of adjusting frequency variables, irreversible loss and damages to the switches under test are tremendously generated due to constant frequency switching and changes therein.

Therefore, on account of above, to overcome the above-mentioned problems, it should be obvious that there is indeed an urgent need for the professionals in the field for proposing a new control method to be developed that can effectively solve the above mentioned problems occurring in the prior design. And by using such novel control method, an optimal power transmission efficiency can be effectively guaranteed and the long-standing deficiencies of many previous prior arts are effectively avoided so as to implement an optimization result of the wireless power transmission system. Hereinafter, the detailed specific implementations will be fully described in the following paragraphs.

SUMMARY OF THE INVENTION

In order to overcome the above mentioned disadvantages, one major objective in accordance with the present invention is provided for a control method of a minimum power input. Due to the proposed method of the invention, it achieves to generate rapid and instant response and optimize efficiency of a typical amplifier circuit by employing a relatively simple and efficient control method, which is compatible with parameters of the charge pump reservoir and the gate driving circuit.

In another aspect, another major objective in accordance with the present invention is provided for an extremely innovative control method, which performs to adjust an input voltage signal, the duty ratio and resonant frequency of a control voltage signal so as to minimize the power input and meanwhile ensure an optimal power transmission efficiency.

In addition, since parameters of a charge pump reservoir and the gate driving circuit can be further designed in view of the trend feedback of the gate drive waveforms, the present invention also achieves to realize a variety of applications of the depletion-mode GaN high electron mobility transistor (HEMT) in wireless power transmission systems.

And yet in another aspect, one another major objective in accordance with the present invention is provided for a control method of a minimum power input which is applicable to a class E amplifier circuit. By employing the proposed control method, it avoids the usage of typical conventional diodes, and uses depletion-mode GaN HEMT instead, so as to implement the applications of a class E amplifier circuit and optimize its power efficiency.

As a result, for achieving the above mentioned objectives, the technical solutions of the present invention are aimed to provide a control method of a minimum power input which is applicable to a wireless power transfer (WPT) system including a power transmission unit (PTU) and at least one power receiving unit (PRU). The power transmission unit is electrically connected with a control voltage signal and an input voltage signal and accordingly generates the minimum power input. And, the power transmission unit transmits the minimum power input wirelessly through a wireless transmission to the at least one power receiving unit for receiving. The control method disclosed by the present invention comprises the following steps.

(a): obtaining a distance, which is between the power transmission unit and the at least one power receiving unit.

(b): determining the input voltage signal based on the distance and a number of the at least one power receiving unit.

(c): computing a power input curve based on the input voltage signal and determining a minimum value of the power input curve, wherein the minimum value correlates with a specific resonant frequency and a specific duty ratio of the control voltage signal.

(d): retrieving the specific duty ratio and the specific resonant frequency sequentially which are corresponding to the minimum value.

(e): inputting the control voltage signal having the specific duty ratio and the specific resonant frequency into the power transmission unit, such that the power transmission unit accordingly generates the minimum power input ($P_{in,min}$) which is received sufficiently by the at least one power receiving unit.

According to the embodiment of the present invention, the power transmission unit comprises a gate driving circuit, a pair of tuning resistor, a charge pump reservoir, a switching component and an amplifier circuit. The gate driving circuit receives the control voltage signal, the pair of tuning resistor is connected between the gate driving circuit and the charge pump reservoir, and the switching component is connected with the charge pump reservoir and the amplifier circuit. When the gate driving circuit receives the control voltage signal having the specific duty ratio and the specific resonant frequency, and the amplifier circuit receives the input voltage signal, the minimum power input ($P_{in,min}$) is accordingly generated at an output terminal of the amplifier circuit through turning on and turning off of the switching component.

In one embodiment, the switching component, for example, can be a GaN HEMT. The amplifier circuit, for example, can be a class E amplifier circuit, which includes a capacitor, a first inductor, a second inductor and a load resistor. A node is configured between the switching component, the first inductor and the capacitor. Another end of the first inductor which is opposite to the node is connected with the input voltage signal, and another end of the capacitor which is opposite to the node is connected with the second inductor. The second inductor is further connected to the load resistor, such that the minimum power input is accordingly generated at the output terminal which is located between the second inductor and the load resistor.

According to one embodiment of the present invention, the switching component can also be a metal-oxide-semiconductor field-effect transistor (MOSFET), a drain electrode of the MOSFET is connected to the node, a gate electrode of the MOSFET is connected to the charge pump reservoir and a source electrode of the MOSFET is connected to ground.

Moreover, when determining the minimum value in step (c) of the present invention, the control method further comprises: providing a plurality of transmission power successively to the at least one power receiving unit for receiving; and finding out a minimum of the plurality of transmission power which is sufficient for the at least one power receiving unit to receive and considering the minimum as the minimum value.

In addition, the pair of tuning resistor of the power transmission unit may further comprise a first resistor and a second resistor which are connected in parallel. The gate driving circuit at least comprises a PMOS and an NMOS which are connected in series, wherein the first resistor is connected between a drain electrode of the PMOS and the charge pump reservoir, and the second resistor is connected between a drain electrode of the NMOS and the charge pump reservoir. In order to obtain an optimal effect of the present invention, the proposed control method may further comprise designing the charge pump reservoir in view of parameters of the first resistor and the second resistor so as to accordingly generate the minimum power input and optimize the generated minimum power input.

According to other embodiments of the present invention, the wireless power transfer system may alternatively include a plurality of the at least one power receiving unit when necessary, and the minimum power input generated by the present invention can also be transmitted wirelessly through the wireless transmission to the plurality of the at least one power receiving unit for being received and used sufficiently by the plurality of the at least one power receiving unit.

In general, those skilled in the art and having general knowledge are able to make appropriate modifications or variations with respective to the technical solutions disclosed in the present invention without departing from the spirits of the present invention. However, the modifications or variations should still fall into the scope of the present invention. The present invention is certainly not limited to the internal circuit connections and/or electrical characteristics disclosed in these embodiments.

Therefore, to sum above, it is apparent that, the present invention mainly discloses a control method of the minimum power input for a WPT system. According to the control method disclosed in the present invention, by employing the control strategy of adjusting the input voltage signal, duty ratio and resonant frequency of the control voltage signal, as well as a relatively simple look-up method using empirical data, the present invention is successful in meeting operating requirements in a 6.78 MHz resonant wireless power transmission application, and ensuring an optimal power transmission efficiency of the wireless power transmission system.

The applicants emphasize and assert that, the foregoing embodiments of the present invention are described with a class E amplifier circuit, merely for an illustrative example as to enable those skilled in the art to fully understand the technical features of the present invention and are not intended to limit the application of the present invention. In other words, the control method of the minimum power input disclosed in the present invention can also be further applied to various types of amplifier circuits, and not limited to a class E amplifier circuit.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
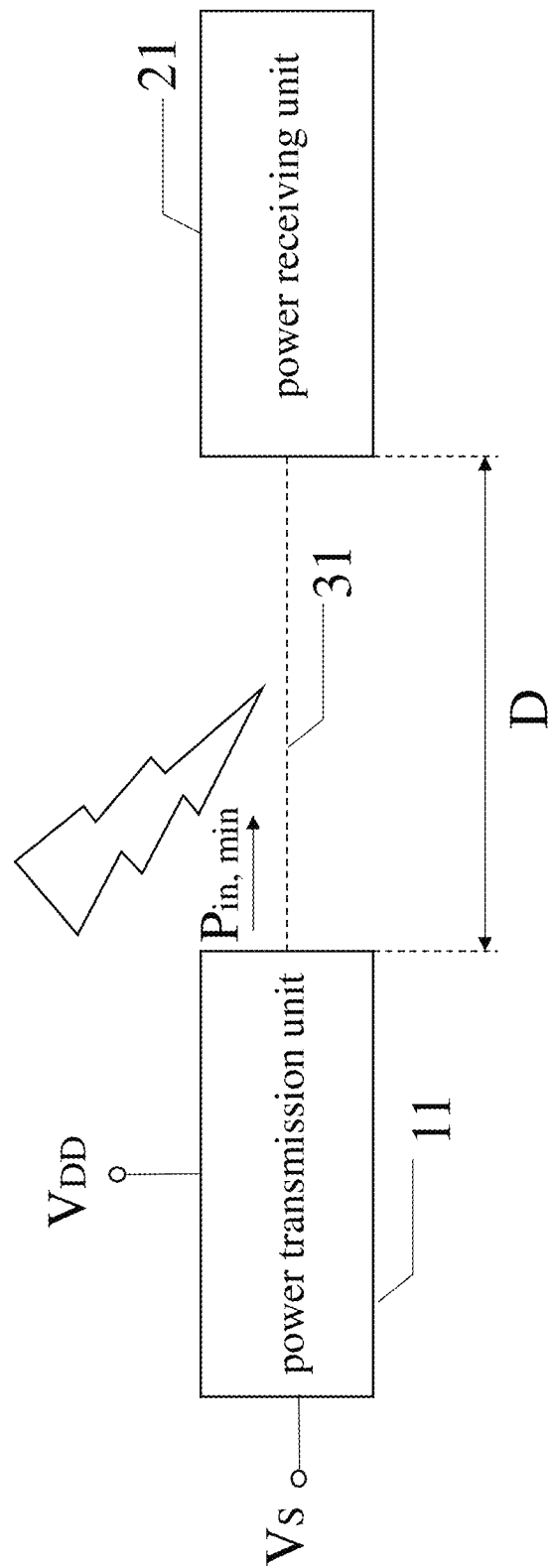
FIG. 1 shows a schematic diagram of a wireless power transfer (WPT) system in accordance with one embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

As known, performances of a class E amplifier circuit are mostly affected by its various load change and non-ideal factors. Although the existing prior arts have provided several analysis methods in considering of the non-ideal factors, including inductors, resistors, parasitic capacitance inductance, on-resistance, leakage current, and so on, for theoretically reducing the difference between its calculated result and the actual one, nevertheless, such conventional control and compensation methods are still considered to be much more complicated. In addition, the parameters of its gate driver are also difficult to drive and comply with power devices such as depletion-mode gallium nitride devices, etc. Therefore, in order to improve the circuit performance effectively and meanwhile extend transmission distance in a wireless power transmission system, the present invention discloses a control method of a minimum power input which is applicable to a wireless power transfer (WPT) system. Regarding the proposed embodiments of the present invention which will be disclosed in the following paragraphs, it is intended to clarify that these embodiments are disclosed for illustrating the main technical contents and technical characteristics of the present invention, and to enable those skilled in the art to understand, manufacture, and use the present invention. However, it should be noted that these embodiments are not intended to limit the scope of the present invention. And therefore, it is believed that any equivalent modifications or variations thereof based on the spirits of the present invention should also be included in the scope of the present invention.

Figure 2:
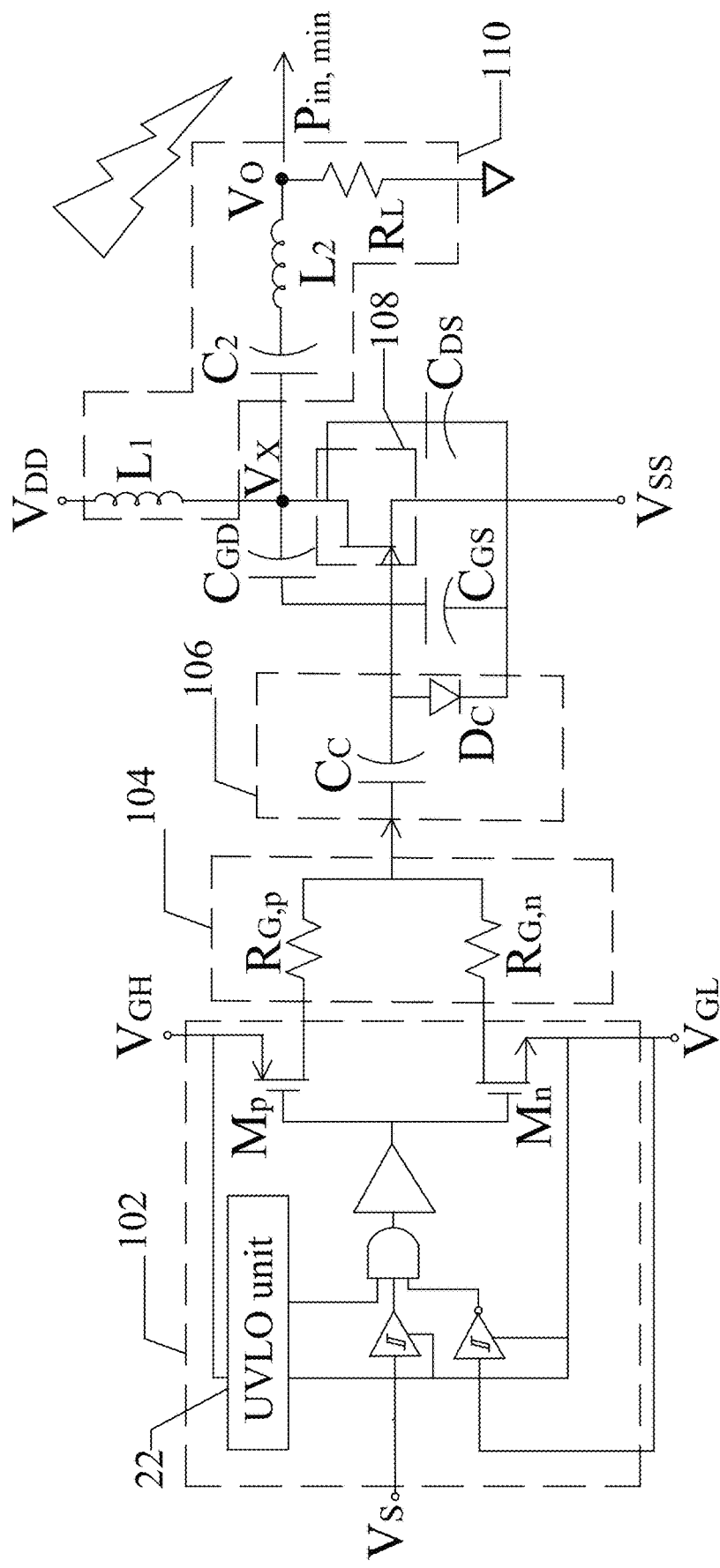
FIG. 2 shows a detailed circuit diagram of the power transmission unit in accordance with the embodiment of the present invention.

The proposed control method of the present invention is applicable to a wireless power transfer system. Please refer to FIG. 1, which shows a schematic diagram of a wireless power transfer (WPT) system in accordance with one embodiment of the present invention, in which the WPT system includes a power transmission unit 11 and at least one power receiving unit 21. The power transmission unit 11 is electrically connected with a control voltage signal $V_S$ and an input voltage signal $V_{DD}$ and accordingly generates a minimum power input $P_{in,min}$ by employing its internal circuits. And, the minimum power input $P_{in,min}$ will be transmitted wirelessly through a wireless transmission 31 to the at least one power receiving unit 21 for receiving. Please refer to FIG. 2 at the same time. FIG. 2 shows a detailed circuit diagram of the power transmission unit in accordance with the embodiment of the present invention. As shown, the power transmission unit 11 includes a gate driving circuit 102, a pair of tuning resistor 104, a charge pump reservoir 106, a switching component 108 and an amplifier circuit 110. The gate driving circuit 102 at least includes an undervoltage lockout (UVLO) unit 22, a P-type metal-oxide-semiconductor field-effect transistor (PMOS) $M_p$ and an N-type metal-oxide-semiconductor field-effect transistor (NMOS) $M_n$, wherein the PMOS $M_p$ and the NMOS $M_n$ are connected in series. The pair of tuning resistor 104 includes a first resistor $R_{G,p}$ and a second resistor $R_{G,n}$ which are connected in parallel, and the pair of tuning resistor 104 is connected between the gate driving circuit 102 and the charge pump reservoir 106.

A drain electrode of the PMOS $M_p$ is connected with the first resistor $R_{G,p}$. A source electrode of the PMOS $M_p$ is connected with a high voltage level $V_{GH}$. A drain electrode of the NMOS $M_n$ is connected with the second resistor $R_{G,n}$. A source electrode of the NMOS $M_n$ is connected with a low voltage level $V_{GL}$. The gate driving circuit 102 receives the foregoing control voltage signal $V_S$.

The charge pump reservoir 106 includes a charge pump capacitor $C_C$ and a diode $D_C$. The first resistor $R_{G,p}$ and the second resistor $R_{G,n}$ which are connected in parallel, are commonly connected to the charge pump capacitor $C_C$. The switching component 108 is connected between the charge pump capacitor $C_C$, the diode $D_C$ and the amplifier circuit 110. According to one embodiment of the present invention, the switching component 108, for instance can be a metal-oxide-semiconductor field-effect transistor (MOSFET). A drain electrode of the MOSFET is connected to a node $V_X$ and further in connection with the amplifier circuit 110. A gate electrode of the MOSFET is connected to the charge pump capacitor $C_C$ and the diode $D_C$ of the charge pump reservoir 106, and a source electrode of the MOSFET is connected to ground $V_{SS}$. In a preferred embodiment of the present invention, the above-mentioned switching component 108 can be a depletion-mode (D-mode) GaN high electron mobility transistor (GaN HEMT).

Therefore, when the control voltage signal $V_S$ is input to the gate driving circuit 102 and the amplifier circuit 110 receives the input voltage signal $V_{DD}$, through turning on and turning off of the switching component 108 (preferably a GaN HEMT), a corresponding power can be accordingly generated at an output terminal $V_O$ of the amplifier circuit 110. The present invention is aimed to provide a novel control method for minimizing the correspondingly generated power, so as to obtain the minimum power input $P_{in,min}$ through our proposed control method. Please find Table 1 as follows for electrical characteristics of the D-mode GaN HEMT to be used in the embodiment of the present invention.

TABLE 1

| parameter | | value | unit |
|---|---|---|---|
| $V_{GS, ON}$ | turn-on voltage | −7 | V |
| $C_{DS}$ | drain-source parasitic capacitance | 100 | pF |
| $C_{GD}$ | gate-drain parasitic capacitance | 80 | pF |
| $C_{GS}$ | gate-source parasitic capacitance | 420 | pF |
| $V_{GS, max}$ | maximum gate-source voltage | 8 | V |
| $V_{DS, BD}$ | drain-source breakdown voltage | 1000 | V |
| $i_{d, max}$ | maximum drain current | 35 | A |

In one embodiment, the amplifier circuit 110 of the present invention is described as a class E amplifier circuit for an illustrative example. Please refer to Table 2 below for effective parameters of the class E amplifier circuit to be used in the embodiment of the present invention.

TABLE 2

| | unit | value |
|---|---|---|
| $R_L$ | kΩ | 5 |
| $C_{DS}$ | pF | 100 |
| $C_2$ | pF | 75 |
| $L_1$ | μH | 47 |
| $L_2$ | μH | 8 |

According to the embodiment of the present invention, the class E amplifier circuit includes a capacitor $C_2$, a first inductor $L_1$, a second inductor $L_2$ and a load resistor $R_L$. The node $V_X$ is configured between the switching component 108, the first inductor $L_1$ and the capacitor $C_2$. Another end of the first inductor $L_1$ which is opposite to the node $V_X$ is connected with the input voltage signal $V_{DD}$ and receiving the input voltage signal $V_{DD}$. Another end of the capacitor $C_2$ which is opposite to the node $V_X$ is connected with the second inductor $L_2$, and the second inductor $L_2$ is further connected to the load resistor $R_L$, such that the correspondingly generated power is provided at the output terminal $V_O$ which is located between the second inductor $L_2$ and the load resistor $R_L$. Please refer to FIG. 3, which shows a flow chart of the control method of the minimum power input in accordance with the embodiment of the present invention. By employing the control method as disclosed in FIG. 3, including the steps of S302, S304, S306, S308 and S310, the present invention is aimed to minimize the correspondingly generated power (provided at the output terminal $V_O$), so as to obtain the minimum power input $P_{in,min}$ which can be received and used sufficiently by the at least one power receiving unit.

Figure 3:
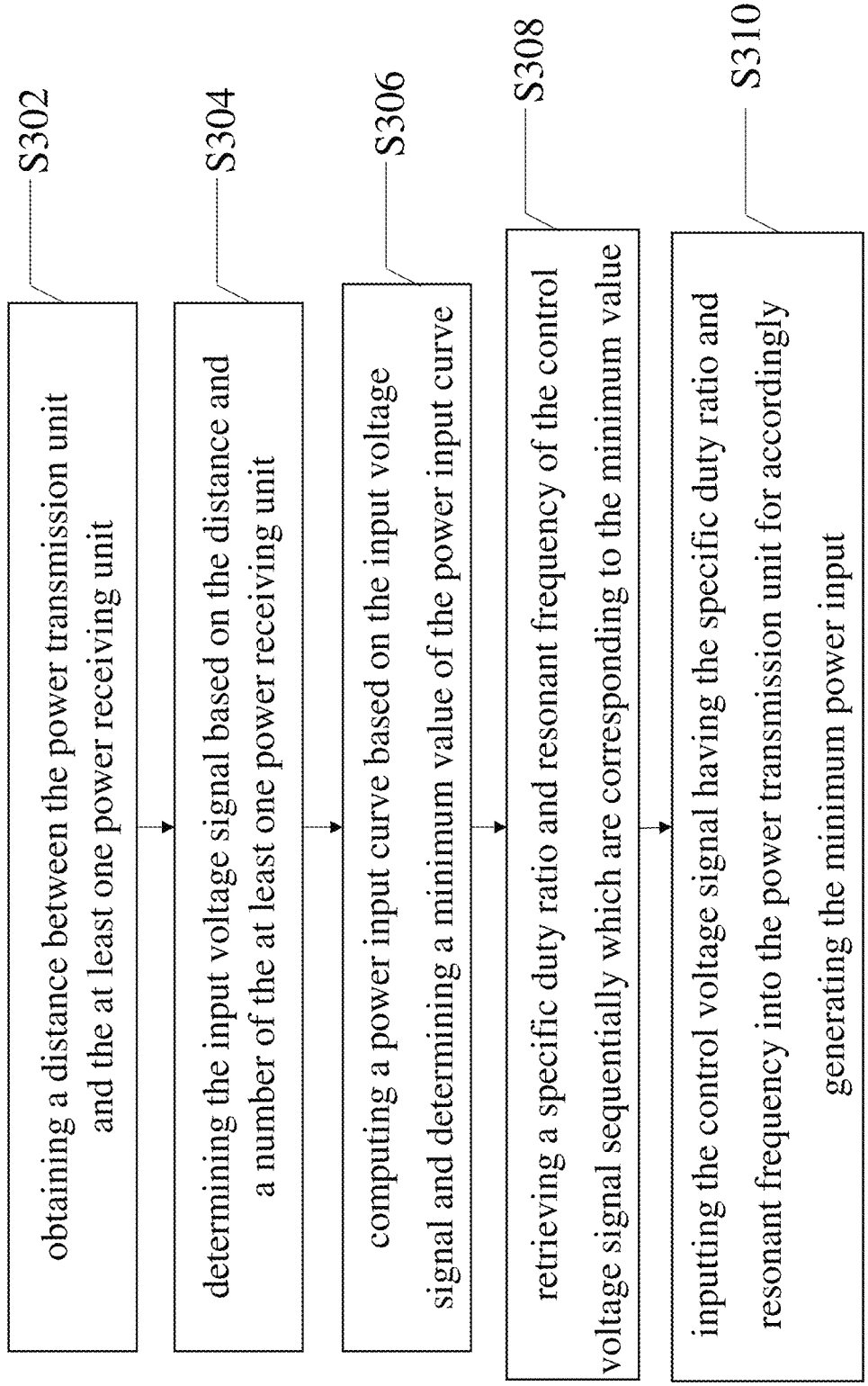
FIG. 3 shows a flow chart of the control method of the minimum power input in accordance with the embodiment of the present invention.
Figure 4:
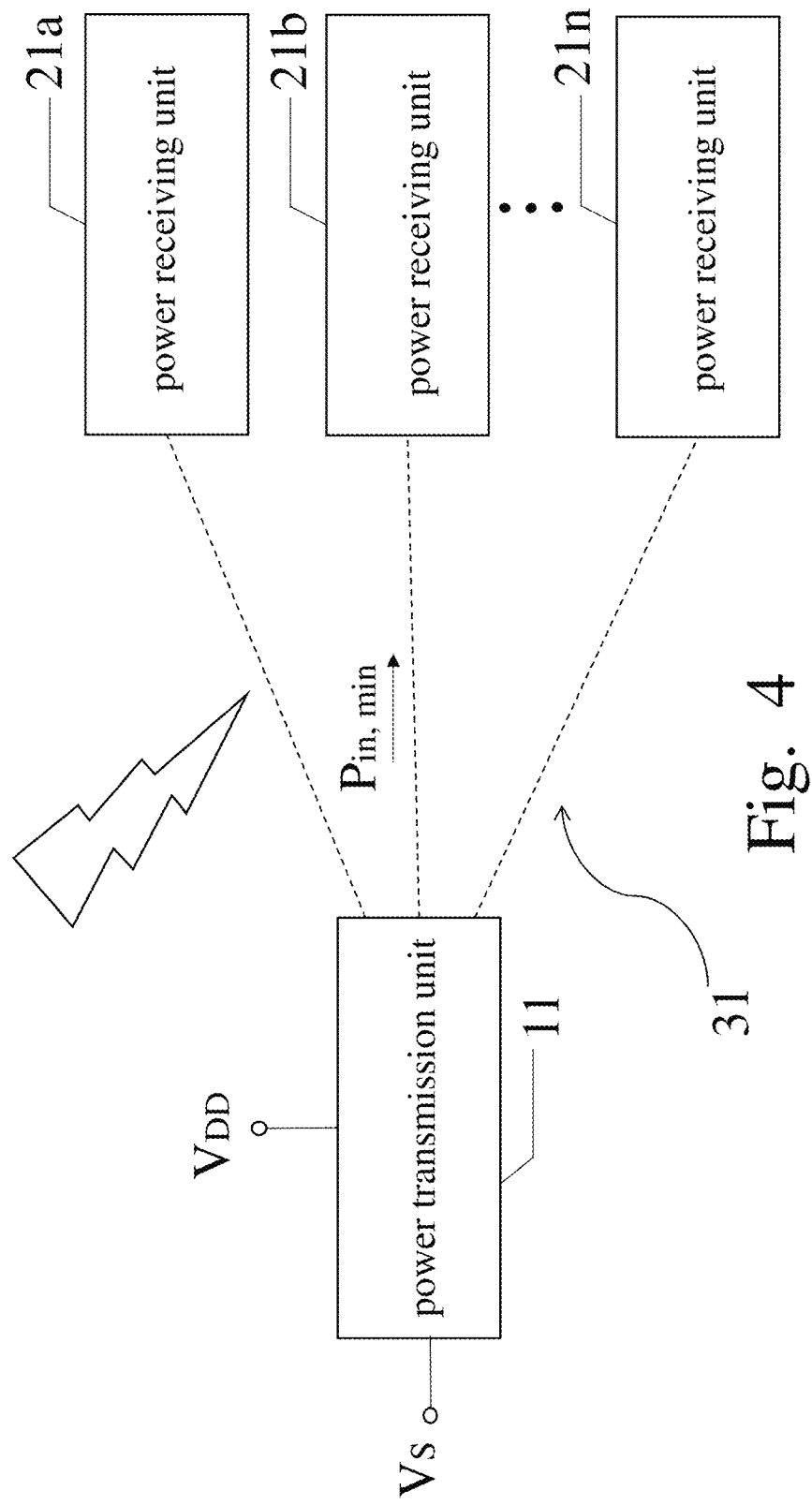
FIG. 4 shows a schematic diagram of a wireless power transfer (WPT) system which includes a plurality of power receiving unit in accordance with another embodiment of the present invention.

Specifically, as shown in the step S302 in FIG. 3, the control method of the present invention obtains a distance first. The distance D, as referring to FIG. 1, is configured between the power transmission unit 11 and the power receiving unit 21. Later, as shown in the step S304, the present invention determines the input voltage signal $V_{DD}$ based on the distance D and a number of the power receiving unit 21. According to the embodiments of the present invention, the number of the power receiving unit 21 is not limited to one. In other words, the WPT system may also alternatively include a plurality of the power receiving unit, as indicated in FIG. 4 of the present invention. In such an embodiment, the correspondingly generated minimum power input $P_{in,min}$ can be transmitted wirelessly through the wireless transmission 31 to the plurality of power receiving unit 21a, 21b . . . 21n, and received and used sufficiently by the plurality of power receiving unit 21a, 21b . . . 21n.

Generally speaking, in the WPT system applications, the farther the power transmission distance is, i.e. the distance D between the power transmission unit 11 and the power receiving units 21, 21a, 21b . . . 21n, the higher the input voltage signal $V_{DD}$ will be required. Meanwhile, under the circumstance that a plurality of power receiving units 21, 21a, 21b . . . 21n are disposed, it is necessary to accordingly increase the input voltage signal $V_{DD}$ for providing sufficient power to the plurality of power receiving units 21, 21a, 21b . . . 21n.

After the input voltage signal $V_{DD}$ is determined, as shown in the step S306, then the present invention is able to compute a power input curve based on empirical data of the input voltage signal $V_{DD}$. Please refer to FIG. 5, in which each power input curve is computed according to different input voltage signal $V_{DD}$. For example, in FIG. 5, three power input curves labelled as triangles, X symbols, and circles, are computed based on $V_{DD}$=36V, 72V, 108V, respectively. And, each power input curve shows how the power input $P_{in}$ correlates with a duty ratio δ of the control voltage signal $V_S$. In such the step, the present invention provides a plurality of transmission power successively to the power receiving unit or the plurality of power receiving units for receiving. And then, the present invention is aimed to find out a minimum of the plurality of transmission power to be transmitted, which is sufficient for the power receiving unit or the plurality of power receiving units to receive. And therefore, it considers the minimum as a minimum value of the power input curve. For example, in one embodiment of the present invention when D=100 cm, the WPT system includes only one power receiving unit and $V_{DD}$=108V, a minimum value of the power input curve is determined as 3.2 W. At this time, as referring to ($P_{in}$ vs. δ) correlations illustrated in FIG. 5, it can be found out that the duty ratio δ of the control voltage signal $V_S$ is 30%.

Figure 5:
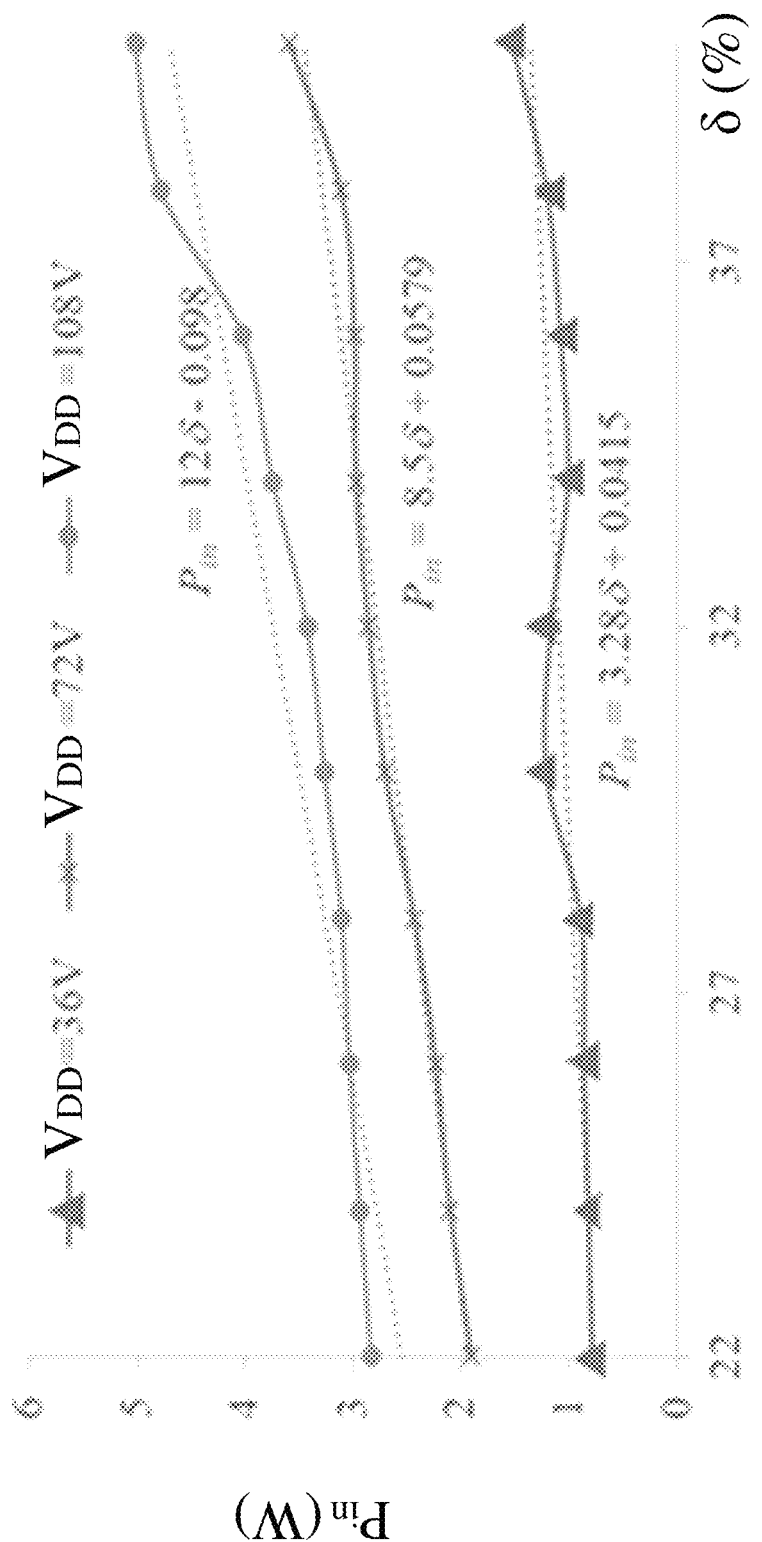
FIG. 5 shows a schematic diagram of the correlation between the power input and the duty ratio of the control voltage signal in accordance with the embodiment of the present invention.
Figure 6:
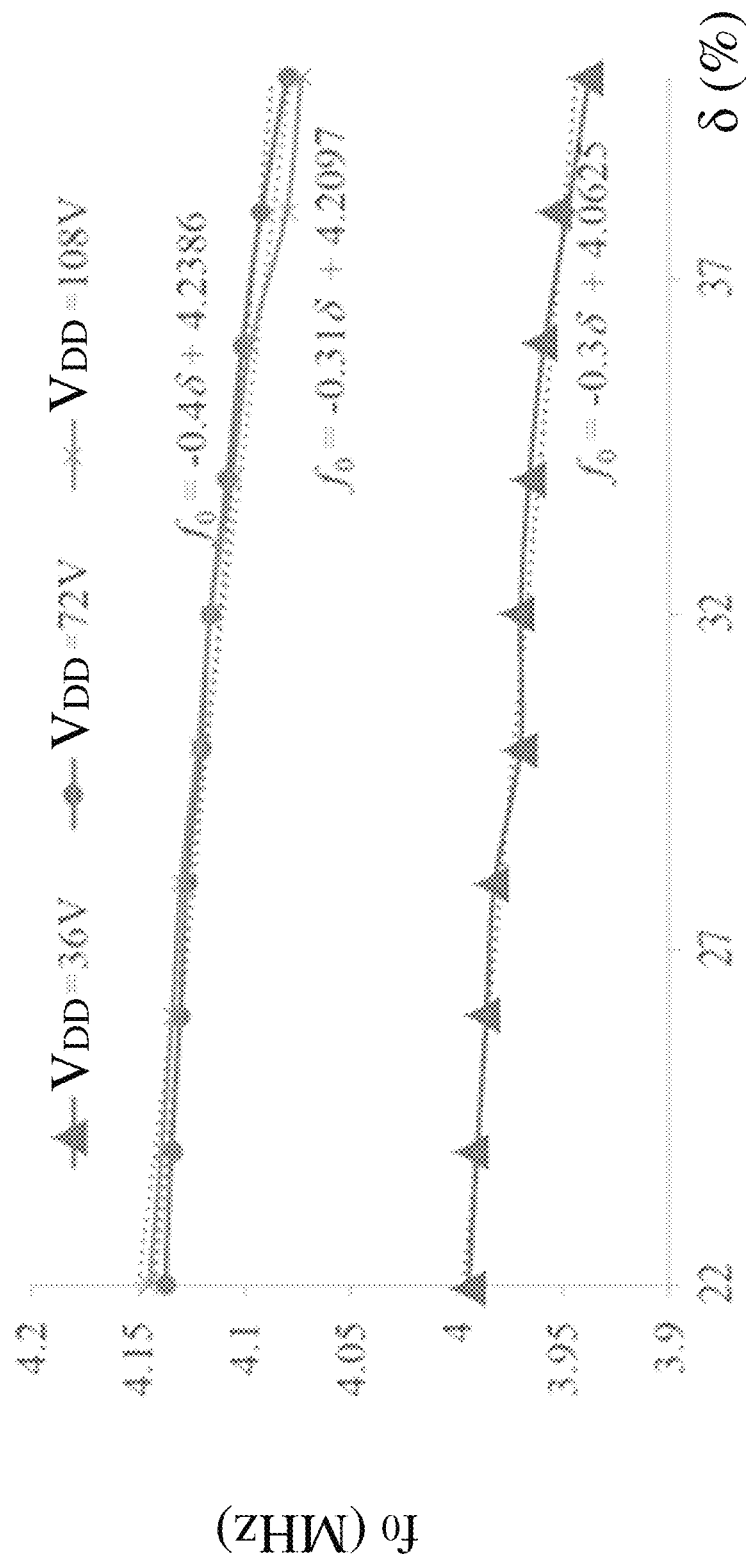
FIG. 6 shows a schematic diagram of the correlation between the duty ratio and the resonant frequency of the control voltage signal in accordance with the embodiment of the present invention.

Afterwards, the step S308 is performed, and please refer to FIG. 6 at the same time. It is obvious that FIG. 6 shows how the duty ratio δ of the control voltage signal $V_S$ correlates with a resonant frequency $f_0$ of the control voltage signal $V_S$. Following the above-mentioned embodiment when δ=30%, it is believed that the resonant frequency $f_0$ of the control voltage signal $V_S$ can be found out as referring to the (δ vs. $f_0$) correlations illustrated in FIG. 6, and $f_0$=4.12 MHz. Therefore, it is apparent that by employing the steps of S306 and S308 of the present invention, once the minimum value of the power input curve is determined and the correlations in FIG. 5 and FIG. 6 are referred, showing that the minimum value correlates with a specific resonant frequency $f_0$ and a specific duty ratio δ of the control voltage signal $V_S$. The present invention is thus able to successfully retrieve the specific duty ratio δ and the specific resonant frequency $f_0$ of the control voltage signal $V_S$ sequentially, which are corresponding to the minimum value, based on the applicants' fine empirical data.

At last, as shown in the step S310, the control voltage signal $V_S$ having the specific duty ratio δ and the specific resonant frequency $f_0$ can be inputted into the power transmission unit 11, and through internal circuits thereof, including the gate driving circuit, the pair of tuning resistor, the charge pump reservoir, the switching component (GaN HEMT) and the amplifier circuit (class E amplifier circuit), the class E amplifier circuit is able to accordingly generate the minimum power input $P_{in,min}$ which is sufficient for the power receiving unit or the plurality of power receiving units to receive and use.

Figure 7:
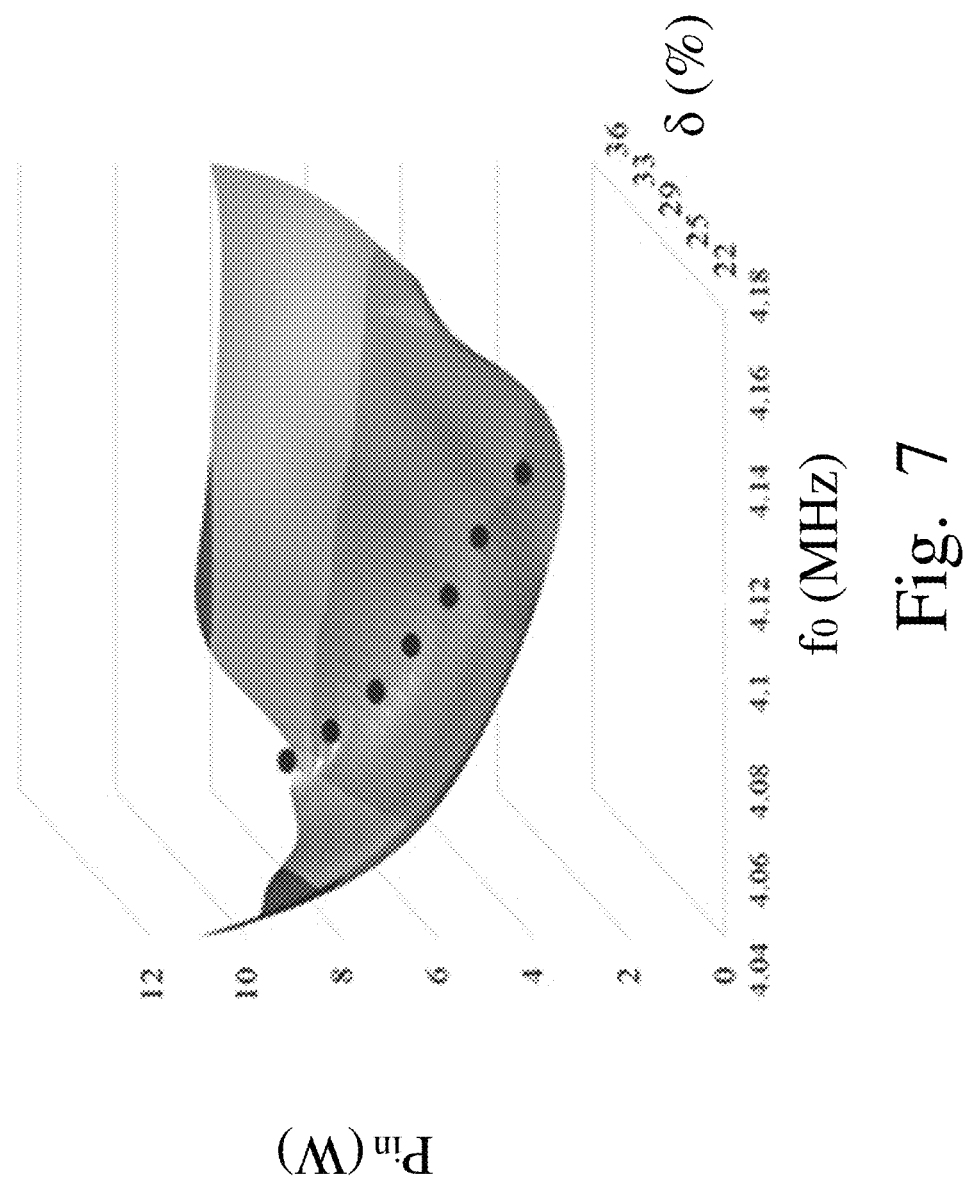
FIG. 7 shows a schematic diagram of various power input caused by different resonant frequency and duty ratio of the control voltage signal under $V_{DD}$=108V.

To be more practical, the Applicants of the present invention further provide a large number of 70 experimental data and perform statistics and interpolation on the experimental results. In such experiments, given that $V_{DD}$=108V, $f_0$=4.12 MHz and δ=30%, the minimum power input is computed. Please refer to FIG. 7, in which the data illustrated in FIG. 7 shows a schematic diagram of various power input $P_{in}$ caused by different resonant frequency $f_0$ and duty ratio δ under $V_{DD}$=108V. Each the minimum power input is represented by a point in the figure and corresponds to a lowest power loss from the switching component to the ground. And according to other embodiments of the present invention, the experimental data can also be applied widely to a variety of input voltage signals $V_{DD}$.

On the other hand, the control method of the minimum power input $P_{in,min}$ of the present invention may further comprise designing the charge pump reservoir in view of parameters of the first resistor $R_{G,p}$ and the second resistor $R_{G,n}$ so as to accordingly generate the minimum power input and to make the generated minimum power input optimized. Please find the following Table 3 for effective parameters of the charge pump reservoir to be used in the embodiment of the present invention.

TABLE 3

| parameter | | value | unit |
|---|---|---|---|
| $R_{G,p}$ | first resistor | 12 | Ω |
| $R_{G,n}$ | second resistor | 30 | Ω |
| $C_C$ | charge pump capacitor | 5 | nF |
| $C_{DC}$ | diode capacitance | 40 | pF |
| $I_R$ | diode reverse saturation current | 50 | μA |

Figure 8:
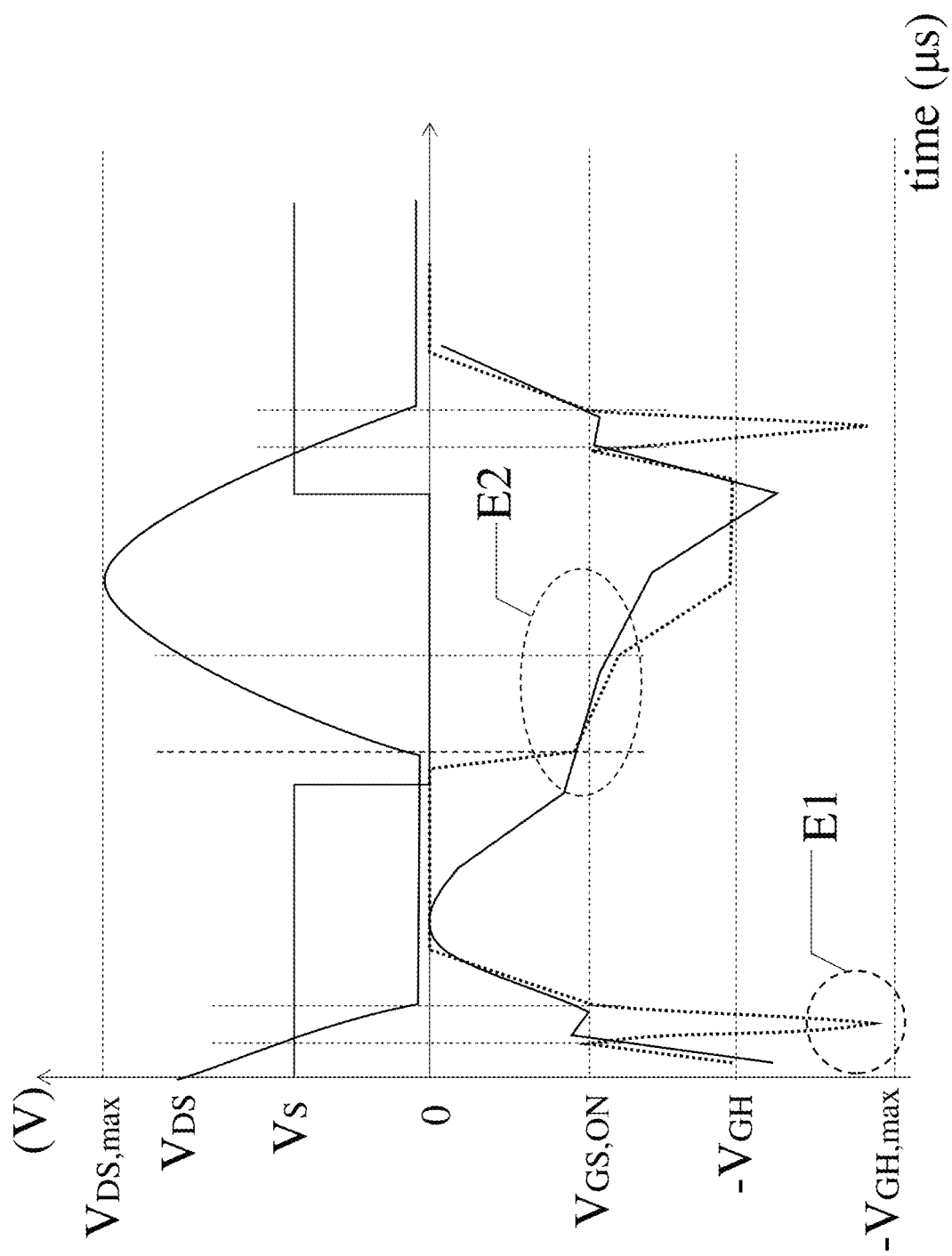
FIG. 8 shows a schematic waveform of the gate-source voltage under the 6.78 MHz switch in accordance with the embodiment of the present invention.

In details, please refer to FIG. 8, which shows a schematic waveform of the gate-source voltage under the 6.78 MHz switch. In the figure, the dashed line and the solid line respectively show a non-ideal and an ideal waveform of the gate-source voltage. $V_{DS}$ is the voltage level of the node $V_X$ in FIG. 2, which is the drain-source voltage level of the switching component 108. From the waveform diagrams, it can be observed that, when $V_{DS}$ is raised to a high voltage level and the gate of the switching component 108 is turned off, the charge pump reservoir 106 will require certain negative charges in a short time due to its gate-drain parasitic capacitance $C_{GD}$ (also known as a Miller capacitor). As for the gate of the switching component 108 being turned on, the charge pump reservoir 106 will need to withdraw the same amount of negative charges. Therefore, in view of its dynamic behaviors, the resulting effect is, when the gate is turned on, the Miller Plain of its waveform shows a low-voltage surge. However, when the gate flips, the Miller Plain of its waveform behaves to show a longer plateau region. If the resistance of the first resistor $R_{G,p}$ is too high (as shown by the dashed line in FIG. 8), then the negative charges will be quickly returned to the first resistor $R_{G,p}$ due to the gate-drain parasitic capacitance $C_{GD}$ and the charge pump capacitor $C_C$. Therefore, the negative voltage surge will be formed, referring as the two areas E1, E2 characterized by the dotted line in FIG. 8. Under a circumstance like this, the negative voltage may drop down below $-V_{GS,max}$ and induce severe gate-source breakdown. As a result, to avoid a situation like this, according to an embodiment of the present invention, it is necessary to adjust and decrease the resistance of the first resistor $R_{G,p}$ so as to prevent the high voltage drop on $V_{GH}$ when the gate is turned on. In the similar design manners when regarding the second resistor $R_{G,n}$, it is definitely also necessary to design the resistance of the second resistor $R_{G,n}$ and its gate drive design parameters with references made to the ideal gate-source voltage such that an ideal waveform, as shown by the solid line in FIG. 8, can be achieved.

Figure 9:
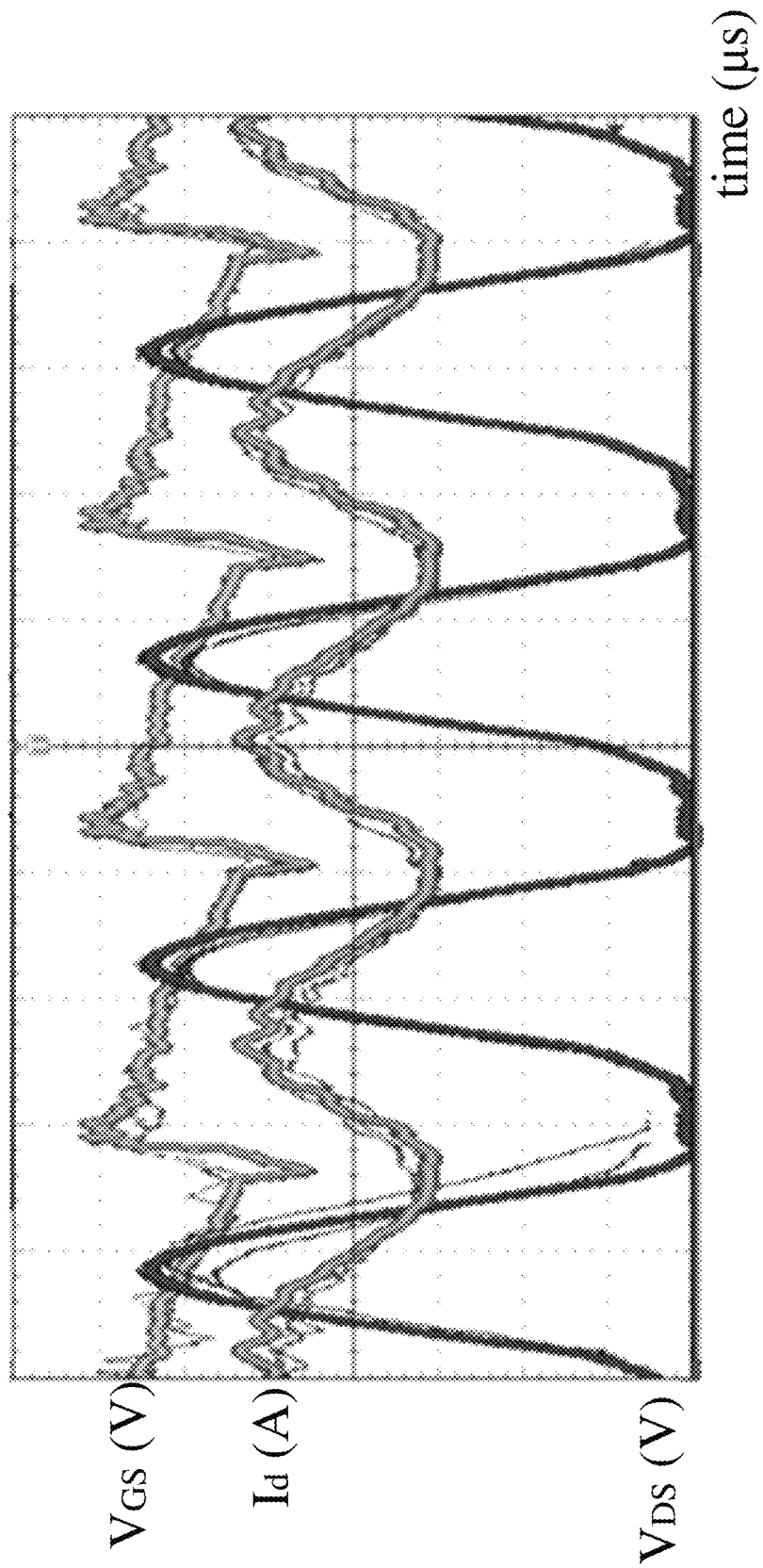
FIG. 9 shows schematic waveform diagrams under $V_{DD}$=262V and a 40 W class E amplifier circuit in accordance with a preferred embodiment of the present invention.

As a result, the control method of the minimum power input disclosed in the present invention may further comprise designing the charge pump reservoir and its gate driving circuits in view of the gate drive waveforms of the switching component, so as to accomplish the implementation of D-mode GaN HEMT in wireless power transmission systems, and to guarantee an optimal power transmission efficiency at the same time. Please refer to FIG. 9, which shows schematic waveform diagrams under $V_{DD}$=262V and a 40 W class E amplifier circuit in accordance with a preferred embodiment of the present invention, wherein $V_{GS}$ is shown as an experimental gate-source voltage waveform. It can be seen that by employing the control method of the present invention, it achieves to meet $V_{GS}$:0~−25V, $I_d$:±1 A, and $V_{DS}$:0~660V. $V_{GS}$ represents the gate-source voltage level, $I_d$ represents the current flowing through the second inductor $L_2$ of the class E amplifier circuit, and $V_{DS}$ represents the drain-source voltage level.

Therefore, to sum above, it is apparent that the present invention proposes an extremely novel control method of a minimum power input and accomplishes the implementation of D-mode GaN HEMT in class E amplifier circuits. According to the control method disclosed in the present invention, by employing the control strategy of adjusting the input voltage signal $V_{DD}$, duty ratio δ, and resonant frequency $f_0$, the present invention is able to ensure an optimal power transmission efficiency of the wireless power transmission system. In addition, the operating requirements in 6.78 MHz resonant wireless power transmission applications can also be easily conformed by using a relatively simple look-up method. Furthermore, according to the present invention, parameters of the charge pump reservoir and the gate driving circuit can be further designed in view of the trend feedback of the gate drive waveforms, so as to realize a variety of applications of the depletion-mode GaN HEMT in wireless power transmission systems. And thus, based on the design of the depletion-mode GaN HEMT parameters, it further helps to provide an optimized influence on the system reliability and application realization of the resonant wireless power transmission (WPT) system as well.

It is worth reminding that the present invention is certainly not limited to the plurality of internal circuit layouts as disclosed above in the earlier paragraphs. In other words, those skilled in the art are able to make modifications and variations according to the actual circuit specifications, with equality based on the contents and spirits of the invention, and yet, still fall into the scope of the invention.

In view of the above, it is believed that, compared with the prior arts, the embodiments of the present invention and the control method being proposed are able to effectively solve the issues and deficiencies existing in the prior arts. Also, the present invention achieves not only to generate rapid and instant response and optimize the efficiency of a class E amplifier circuit based on electrical characteristics of the GaN HEMT and parameters of the depletion-mode GaN HEMT which is compatible with the charge pump reservoir and the gate driving circuit, but also to be able being widely applied in a variety of wireless charging or power converter devices in the semiconductor industry, integrated circuit industry, or power electronics industry and so on. As a result, the Applicants assert that the present invention is instinct, effective and highly competitive for incoming technologies, industries and researches developed in the future. Meanwhile, the Applicants also provide a variety of experimental data, empirical data, and so on to verify that the technical features, means and effects achieved by the present invention are significantly different from the current solutions, and can not be accomplished easily by those who are familiar with the industry. As a result, it is believed that the present invention is indeed characterized by patentability and shall be patentable soon in a near future.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A control method of a minimum power input, applicable to a wireless power transfer system including a power transmission unit and at least one power receiving unit, wherein the power transmission unit is electrically connected with a control voltage signal and an input voltage signal and accordingly generates the minimum power input, and wherein the power transmission unit transmits the minimum power input wirelessly to the at least one power receiving unit for receiving, the control method comprising:
measuring a distance, which is between the power transmission unit and the at least one power receiving unit and obtaining the distance;
   measuring the input voltage signal and determining the input voltage signal based on the distance and a number of the at least one power receiving unit;
   computing a power input curve based on the input voltage signal and determining a minimum value of the power input curve, wherein the minimum value correlates with a specific resonant frequency and a specific duty ratio of the control voltage signal;
   measuring the specific duty ratio and the specific resonant frequency of the control voltage signal and retrieving the specific duty ratio and the specific resonant frequency sequentially which are corresponding to the minimum value; and
   inputting the control voltage signal having the specific duty ratio and the specific resonant frequency into the power transmission unit, such that the power transmission unit accordingly generates the minimum power input which is received sufficiently by the at least one power receiving unit, wherein the power transmission unit comprises a gate driving circuit, a pair of tuning resistor, a charge pump reservoir, a switching component and an amplifier circuit, the gate driving circuit receives the control voltage signal, the pair of tuning resistor is connected between the gate driving circuit and the charge pump reservoir, the switching component is connected with the charge pump reservoir and the amplifier circuit, and wherein when the gate driving circuit receives the control voltage signal having the specific duty ratio and the specific resonant frequency, and the amplifier circuit receives the input voltage signal, the minimum power input is accordingly generated at an output terminal of the amplifier circuit through turning on and turning off of the switching component.

2. The control method of the minimum power input of claim 1, wherein the wireless power transfer system includes a plurality of the at least one power receiving unit, and the minimum power input is transmitted wirelessly to the plurality of the at least one power receiving unit for being received and used sufficiently by the plurality of the at least one power receiving unit.

3. The control method of the minimum power input of claim 1, wherein the switching component is a GaN high electron mobility transistor (GaN HEMT).

4. The control method of the minimum power input of claim 1, wherein the amplifier circuit is a class E amplifier circuit.

5. The control method of the minimum power input of claim 4, wherein the class E amplifier circuit comprises a capacitor, a first inductor, a second inductor and a load resistor, a node is configured between the switching component, the first inductor and the capacitor, another end of the first inductor which is opposite to the node is connected with the input voltage signal, another end of the capacitor which is opposite to the node is connected with the second inductor, and the second inductor is further connected to the load resistor, such that the minimum power input is accordingly generated at the output terminal which is located between the second inductor and the load resistor.

6. The control method of the minimum power input of claim 5, wherein the switching component is a metal-oxide-semiconductor field-effect transistor (MOSFET), a drain electrode of the MOSFET is connected to the node, a gate electrode of the MOSFET is connected to the charge pump reservoir and a source electrode of the MOSFET is connected to ground.

7. The control method of the minimum power input of claim 1, when determining the minimum value, further comprising:
   providing a plurality of transmission power successively to the at least one power receiving unit for receiving; and
   finding out a minimum of the plurality of transmission power which is sufficient for the at least one power receiving unit to receive and considering the minimum as the minimum value.

8. The control method of the minimum power input of claim 1, wherein the pair of tuning resistor comprises a first resistor and a second resistor which are connected in parallel, and the control method further comprises designing the charge pump reservoir in view of parameters of the first resistor and the second resistor so as to accordingly generate the minimum power input.

9. The control method of the minimum power input of claim 8, wherein the gate driving circuit at least comprises a PMOS and an NMOS which are connected in series, the first resistor is connected between a drain electrode of the PMOS and the charge pump reservoir, and the second resistor is connected between a drain electrode of the NMOS and the charge pump reservoir.

* * * * *